United States Patent [19]
Hsue et al.

[11] Patent Number: 5,661,047
[45] Date of Patent: Aug. 26, 1997

[54] METHOD FOR FORMING BIPOLAR ROM DEVICE

[75] Inventors: Chen-Chiu Hsue; Ming-Tzong Yang, both of Hsin-Chu, Taiwan

[73] Assignee: United Microelectronics Corporation, Hsin-Chu, Taiwan

[21] Appl. No.: 318,213

[22] Filed: Oct. 5, 1994

[51] Int. Cl.$^6$ ............................................. H01L 21/265
[52] U.S. Cl. .................................. 438/130; 438/340
[58] Field of Search ........................ 437/31, 51, 52; 148/DIG. 10, DIG. 11, DIG. 109

[56] References Cited

U.S. PATENT DOCUMENTS

| | | | |
|---|---|---|---|
| 3,721,964 | 3/1973 | Barrett et al. | 340/173 SP |
| 4,045,784 | 8/1977 | Mayumi et al. | 340/173 SP |
| 4,247,343 | 1/1981 | Kruzhanov et al. | 148/1.5 |
| 4,254,427 | 3/1981 | Lohstroh | 357/13 |
| 4,287,569 | 9/1981 | Fukushima | 365/96 |
| 4,373,165 | 2/1983 | Tasch, Jr. | 357/13 |
| 4,399,450 | 8/1983 | Lohstroh | 357/59 |
| 4,516,223 | 5/1985 | Erickson | 365/175 |
| 4,719,599 | 1/1988 | Natsui et al. | 365/201 |
| 5,029,127 | 7/1991 | Uchida et al. | 365/63 |

FOREIGN PATENT DOCUMENTS

| | | |
|---|---|---|
| 55-52255 | 4/1980 | Japan . |
| 55-52256 | 4/1980 | Japan . |

*Primary Examiner*—John Niebling
*Assistant Examiner*—Long Pham
*Attorney, Agent, or Firm*—William H. Wright

[57] ABSTRACT

A method of forming bipolar ROM device on a semiconductor substrate comprises forming a collector region by doping with a dopant of a first polarity, forming an array of common base regions by doping with a dopant of an opposite polarity, forming a plurality of emitter regions selectively in the base regions by doping with a dopant of first polarity and diffusing the dopant into the emitter regions from doped conductors, which conductors are formed as an array of conductors disposed orthogonally relative to the array of common base elements. The conductors are connected to emitter regions traversed thereby and are isolated from other regions by dielectric layers selectively formed over the other regions to prevent diffusion of dopant therethrough to prevent formation of such emitter regions.

14 Claims, 6 Drawing Sheets

METHOD FOR FORMING BIPOLAR ROM DEVICE

BACKGROUND OF THE INVENTION

1. Field of the Invention

This invention relates to bipolar transistor ROM devices and particularly to a fabrication process therefor.

2. Description of Related Art

U.S. Pat. No. 5,029,127 of Uchida et al, for "Bipolar SRAM Having Word Lines as Vertically Stacked Pairs of Conductive Lines Parallely Formed with Holding Current Lines" shows a bipolar SRAM.

Figure 1:
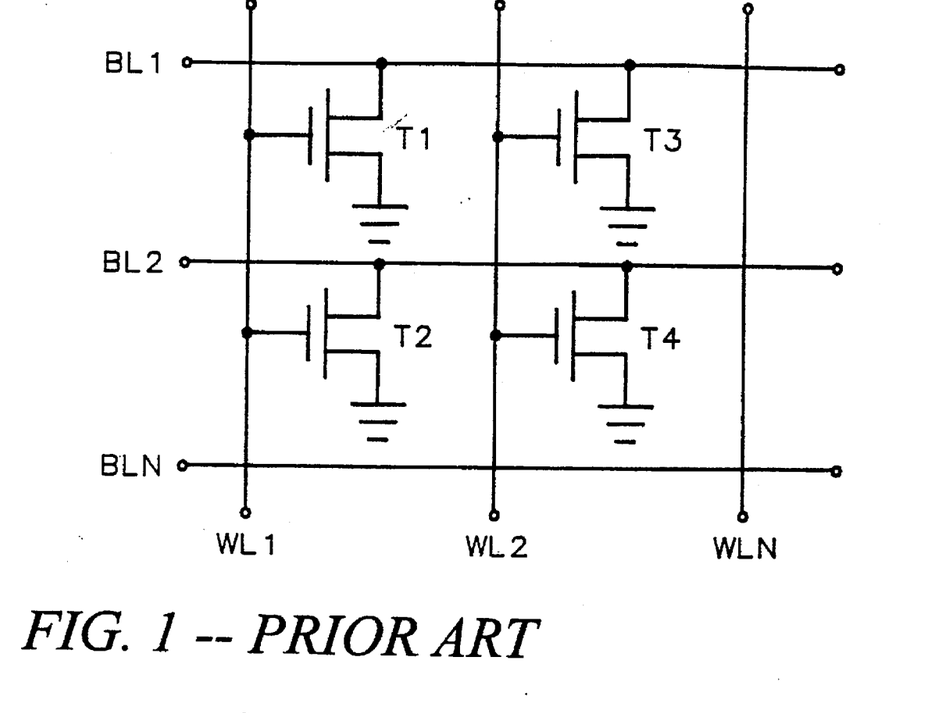
FIG. 1 is a schematic circuit diagram of a prior art FET ROM device.

FIG. 1 is a schematic circuit diagram of a prior art FET ROM with bit lines BL1, BL2 . . . BLN. Word lines WL1, WL2 . . . WLN are shown also. The gates of FET devices T1, T2, T3, and T4 (shown as examples) connect to word lines WL1 and WL2. The sources of FET devices T1, T2, T3, and T4 connect to bit lines BL1 and BL2. The drains of FET devices T1, T2, T3, and T4 connect to reference potential (ground.)

As the geometry of MOS ROMs shrink, the current of an MOS ROM is reduced until at smaller and smaller sizes the current becomes low, causing the speed of the ROM device to be slow because of the reduction of the current level.

Bipolar current devices are relatively insensitive to geometry as compared with MOSFET devices. The current of bipolar devices is from about 1 to about 2 orders of magnitude greater than the current of MOSFET devices of comparable size, so a bipolar ROM of equal size is a far higher speed device. For this technology, a bipolar ROM is a self-aligned structure, so the density is also high.

SUMMARY OF THE INVENTION

A method of forming a bipolar ROM device on a semiconductor substrate by the process comprising forming a collector region by doping with a dopant of a first polarity, forming an array of common base elements by doping with a dopant of an opposite polarity, forming a plurality of emitter regions selectively by doping with a dopant of first polarity, and forming an array of conductors disposed orthogonally relative to array of common base elements, conductors being connected to emitter regions traversed thereby.

Preferably, the base elements are separated by FOX regions; an emitter regions is selectively doped by diffusion from a conductor; emitter regions are selectively formed comprising a cell representing "1" data with other emitter regions being selectively absent to form a cell representing "0" data; a second array of conductors is interleaved between a first array of conductors, and a second set of emitters is associated therewith, a second array of conductors is formed subsequent to formation of the first array of conductors; the silicon nitride being applied to form a mask for FOX regions; and, performing a self-aligned ion implantation of the base regions using the FOX structure to prevent ion implantation therebelow.

In accordance with another aspect of this invention, a bipolar ROM device is formed on a semiconductor substrate. The ROM comprises a collector region doped with a dopant of a first polarity, an array of common base elements doped with a dopant of an opposite polarity, the base elements being separated by FOX regions, a plurality of emitter regions selectively doped with a dopant of the first polarity, and an array of conductors disposed orthogonally relative to the array of common base elements, the conductors being connected to emitter regions traversed thereby.

Preferably emitter regions are selectively doped by diffusion from the conductors, emitter regions are selectively formed comprising a cell representing "1" data with other emitter regions being selectively absent to form a cell representing "0" data; a second array of conductors is interleaved between the first array of conductors, and a second set of emitters is associated therewith; the collector region is N−, the base region is P− and the emitter region is N+ for an NPN bipolar ROM device, or the collector region is P−, the base region is N− and the emitter region is P+ for an PNP bipolar ROM device.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 2:
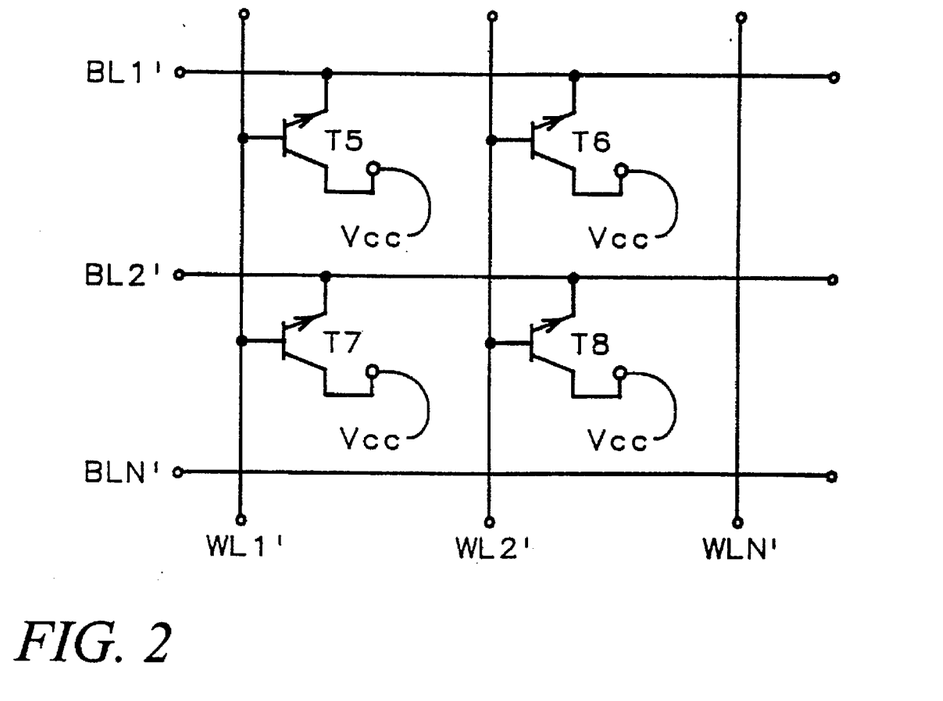
FIG. 2 is a schematic circuit diagram of an NPN bipolar ROM device device in accordance with this invention.

FIG. 2 is a schematic circuit diagram of an NPN bipolar ROM device with bit lines BL1', BL2' . . . BLN'. Word lines WL1', WL2' . . . WLN' are shown, as well. The collectors of the NPN transistors T5, T6, T7, and T8 (shown as examples) are connected to $V_{cc}$; the bases are connected to the word lines WL1', WL2'; and the emitters are connected to to the bit lines BL1' and BL2'. If PNP devices are substituted for the NPN devices, then the collectors are connected to ground. While either NPN or PNP bipolar devices can be employed, the NPN bipolar devices are preferred because of the current gain advantage provided thereby.

Process

Figure 3:
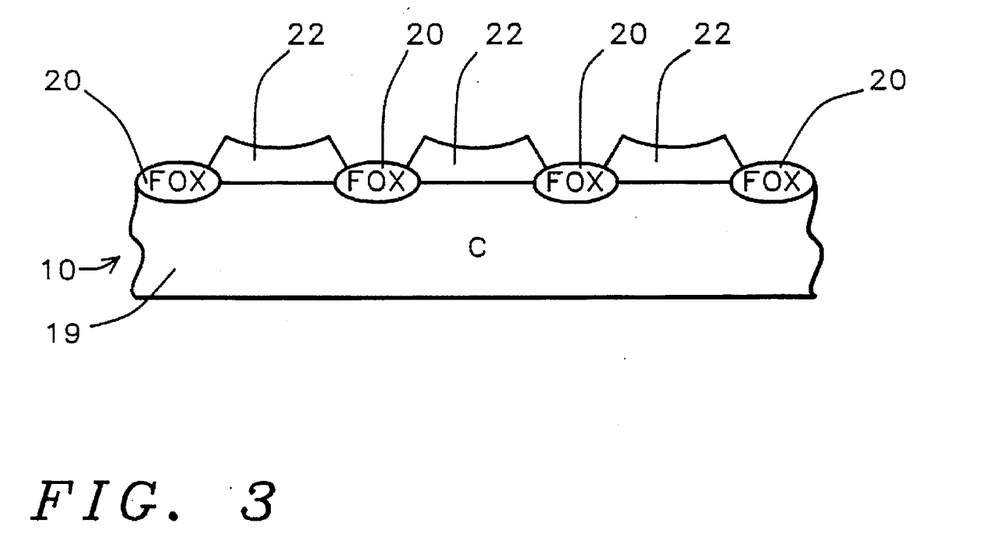
FIGS. 3, 4 and 5 show cross sections of a semiconductor device, as an article of manufacture in the process of manufacture, illustrating the process flow of manufacture of a device in accordance with this invention.
Figure 4:
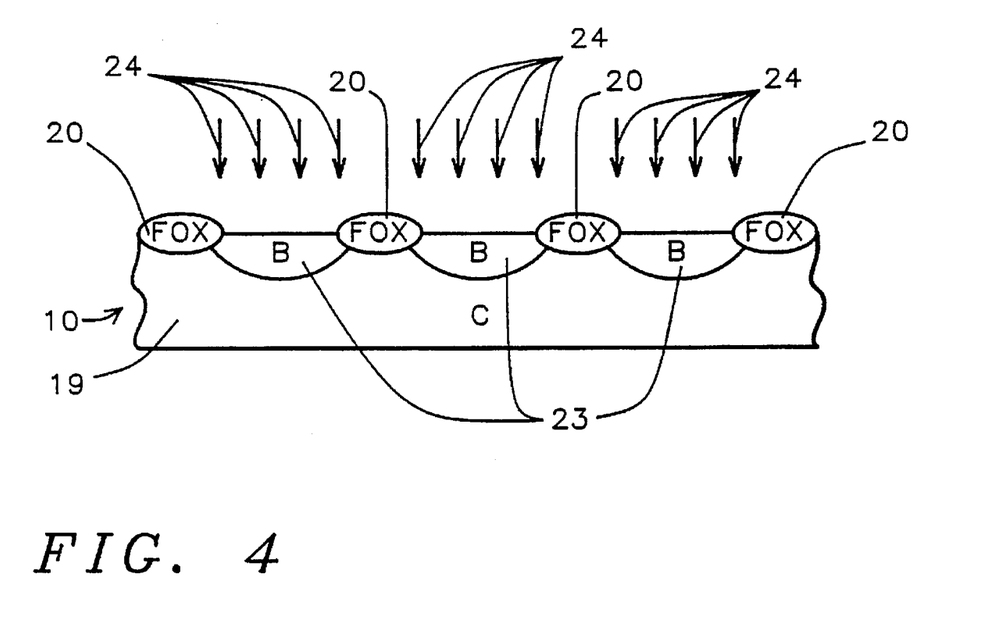
Figure 5:
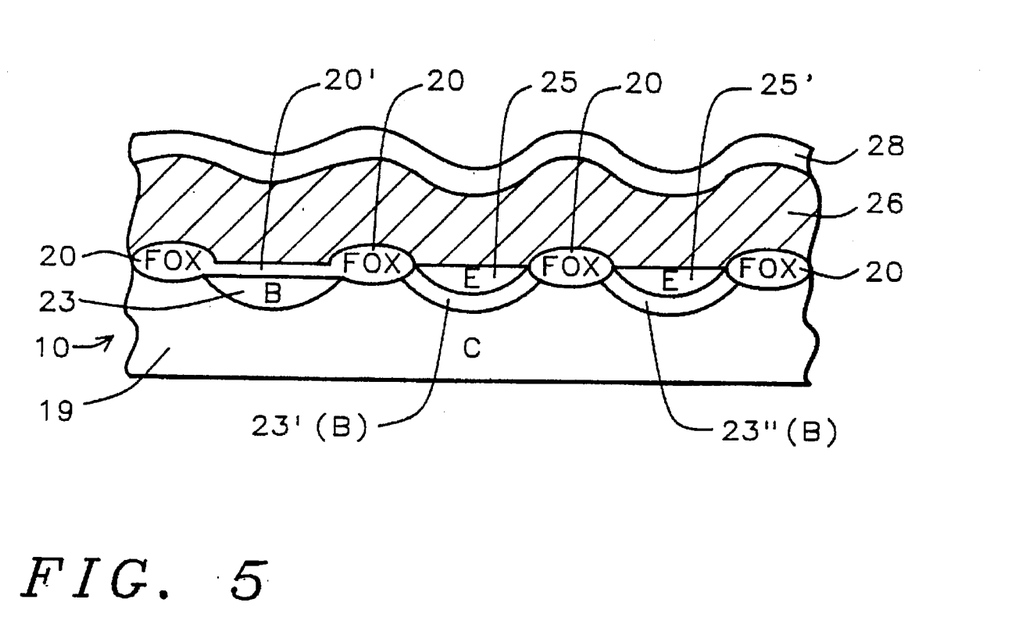

FIGS 3, 4 and 5 show cross sections of a semiconductor device 10 illustrating the process flow of manufacture of a device in accordance with this invention.

LOCOS PROCESS

A cross section of a semiconductor a device 10 formed on a silicon semiconductor substrate is covered with a photolithographic collector mask, as will be well understood by those skilled in the art, (not shown as it is outside the scale of the drawing and not relevant to the subject matter of the invention which relates to the portion of the device being shown.) The collector mask is used while making a collector implantation. An ion implantation with N– ions or P– ions 9 is performed for an NPN or PNP bipolar device respectively.

For an NPN device, an N– collector implant 19 of phosphorus or arsenic ions 9 is performed, preferably employing N ions to form arsenic dopant 9 through the openings in the mask into the substrate 10; and the dose of those N ions implanted should be within the range from about $1 \times 10^{11}/cm^2$ to about $8 \times 10^{19}/cm^2$ at from about 30 keV to about 500 keV.

For a PNP device, a P– collector implant of boron ions (preferably less than about $1 \times 10^{14}/cm^2$) is employed resulting in boron dopant being formed in the P– collector region 19. The dose of the P– ions of boron implanted should be within the range from about $1 \times 10^{11}/cm^2$ to about $8 \times 10^{13}/cm^2$ at from about 30 keV to about 500 keV.

PAD Oxide

The device 10 is shown after formation thereon of a thin layer 11 of pad oxide (silicon dioxide) having a thickness within a range from 50 Å to 500 Å is grown to provide a buffer layer for the silicon nitride layer 12 which is deposited next. Pad oxide layer 11 is grown on the surface of collector region 19 of device 10 by heating device 10 in a furnace within a temperature range from 800° C. to 1100° C. for a time range from 5 minutes to 2 hours.

Silicon Nitride Deposition

Silicon nitride layer 12 is deposited upon the device of FIG. 3B to a thickness within a range from 500 Å to 5,000 Å.

Active Mask

A layer of photoresist 14 is applied to the surface of the device 10 and it is patterned with the "active" mask. An active photoresist mask 14 is formed to define the pattern of the silicon nitride layer 12 by etching through photoresist mask 14 to define the shape to silicon nitride layer 12. Layer 12 into the active mask pattern used in forming FOX regions 20. A layer of photoresist is applied to the surface of the device and it is patterned with the "active" mask.

Silicon Nitride Etch

The device 10 is shown after layer 12 etched to form the active mask pattern used in forming FOX regions 20.

The active is used for patterning the etching of the silicon nitride layer 12. The silicon nitride layer 12 is etched with an etchant comprising $SF_6$, $CF_4$, $Cl_2$ or HBr.

Resist Strip

FIG. 3 shows the device after the photoresist layer 14 applied in the "active mask" step was removed by means of $H_2SO_4$ plus $H_2O_2$ and/or an $O_2$ plasma resist strip.

Formation of Field Oxide

Next, field oxide layer FOX structures 20 are formed. FOX structures are formed where the silicon nitride 12 has been etched away in between the remaining silicon nitride structures 12. FOX structures 20 are formed on the surface of pad oxide layer 11 in a furnace in an atmosphere of $O_2$ or $O_2$ plus $H_2$ within a temperature range from 800° C. to 1200° C. for a time range from 30 minutes to 20 hours.

FORMATION OF BASE REGIONS

Nitride Strip

The remainder of the silicon nitride layer is removed by the process of immersion of device 10 in an H3PO4 solution for from 30 minutes to 300 minutes (5 hours).

Base Mask

As will be well understood by those skilled in the art, a mask is formed by depositing photoresist upon the device and then exposing the photoresist to produce a mask (not shown as it is outside the scale of the drawing and not relevant to the subject matter of the portion of the device being shown) including the base regions 23, 23', and 23" shown in FIG. 4.

Base Self-align Implantation

Referring again to FIG. 4, for an NPN device, after the formation of the base mask, a base P– ion implantation of boron ions or $BF_2$ is performed implanting the P– ions 24 to form boron dopant in base regions 23, 23' and 23" formed in the collector region 19. The dose of the P– ions 24 implanted should be within the range from about $1 \times 10^{12}/cm^2$ to about $5 \times 10^{14}/cm^2$ at from about 20 keV to about 200 keV. The base implantation is self-aligned by using the field oxide (FOX) regions to prevent the implantation of ions 24 in the collector region 19.

Bipolar First Code Mask

Thin Oxidation

The silicon dioxide layer is replaced by a thin film 20 of silicon dioxide which was formed by a furnace to thickness within the range from 50 Å to 1000 Å in the openings between the FOX regions 20.

First Code Mask for Emitter Opening

Figure 6:
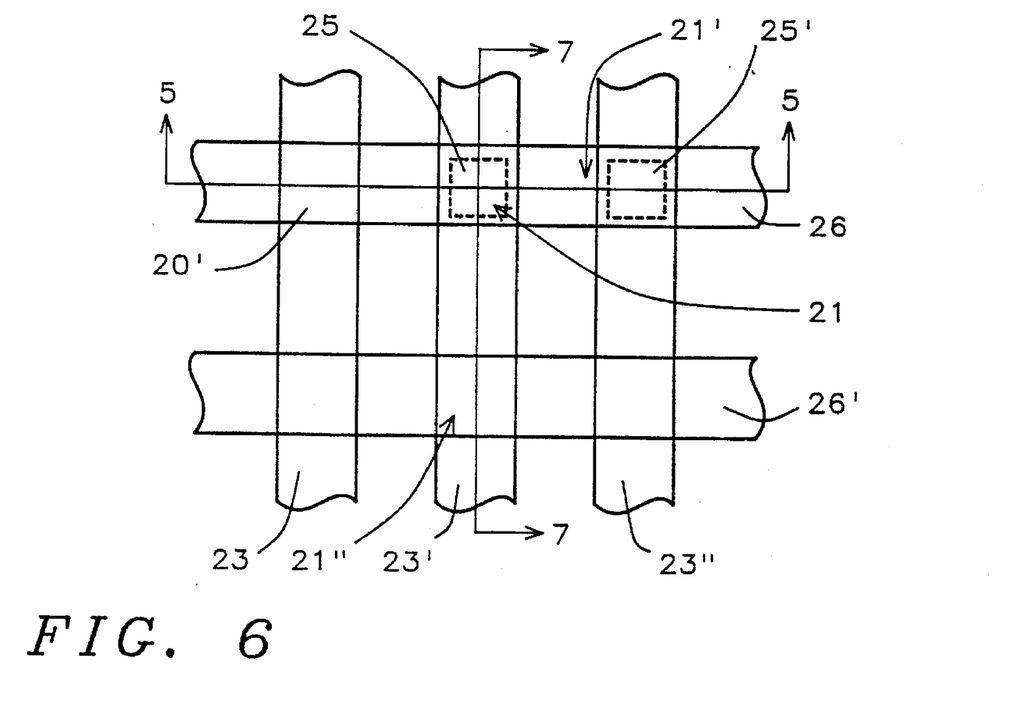
FIG. 6 shows a plan view of a device in accordance with this invention with the buried common base regions (word lines) and the polysilicon bit lines.

A photoresist mask for the first code mask (bipolar first code mask) is formed in the pattern of emitters 25 and 25' shown in FIG. 5 and in a plan view seen in FIG. 6 which is a plan view of a device 10 in accordance with this invention with buried common base regions (word lines) 23, 23' and 23" and polysilicon bit lines 17 and 17'.

Thin Oxide Etch

The device is etched with the first code mask 16 in place. In this emitter etching step, an etchant is employed to etch away the thin oxide layer 20' with HF or BOE or plasma etching with $CHF_3$ or $CF_4$ and $O_2/H_2$ gas. The ROM code is indicated by an emitter or no emitter (by either etching oxide layer or not etching it out), for a binary "1" or "0" where one etches away the oxide layer to produce a "1".

Polysilicon or Polycide Deposition

Referring to FIG. 5, the device is shown after a layer 26 of polysilicon or polycide 26 is applied to the device as shown in FIG. 5. The method of applying the polysilicon or polycide comprises LPCVD bar $SiH_4$ or $SiH_6$ gas at a temperature from about 500° C. to about 700° C. Use of polycide is an optional alternative to polysilicon.

Polysilicon or Polycide Doping

The polysilicon or polycide layer 26 is doped with a material selected from a P/As implant of ions or diffusion of $POCl_3$.

The parameters of a P/As ion implant are a dose of the P/As ions 18 implanted within the range from about $1\times10^{14}$/cm$^2$ to about $5\times10^{16}$/cm$^2$ at from about 15 keV to about 200 keV, then annealing at a temperature from about 700° C. to about 1,000° C. for a time from 5 minutes to 2 hours.

An out-diffusion from polysilicon layer 26 into base regions 23' and 23" forms emitters 25 and 25' respectively in those regions. If doping is performed bar ion implantation then the out-diffusion occurs during the annealing process.

The parameters of a diffusion of $POCl_3$ are heating in an oven at a temperature from about 750° C. to about 1,000° C. for a time from 10 minutes to three hours.

As stated above, an out-diffusion from polysilicon layer 26 forms emitters 25 and 25'. For $POCl_3$ doping by diffusion, out-diffusion occurs simultaneously with the diffusion process used for such doping.

Oxide Deposition

Figure 7:
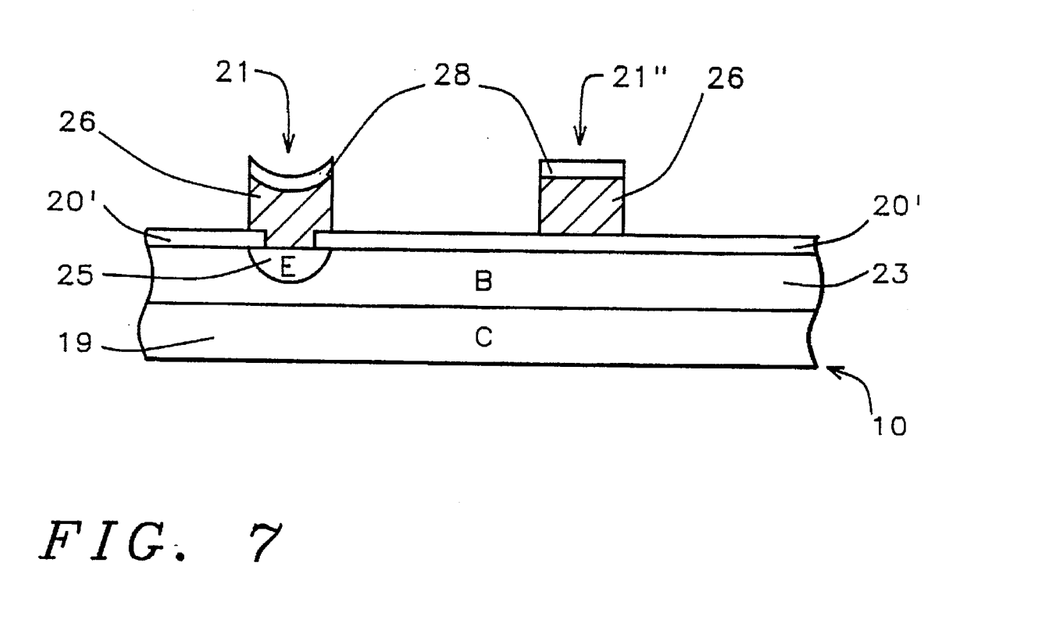
FIG. 7 shows a section of the device of FIG. 6, in accordance with this invention, taken along line 7—7.

Referring FIG. 7, a silicon dioxide film 28 is formed by CVD to a thickness within the range from 200 Å to 5,000 Å.

Polysilicon or Polycide Mask

A photoresist mask 28' for the layer 26 of polysilicon or polycide is formed in the pattern of polysilicon bit lines 26 and 26' shown in FIG. 7 for use later in etching of polysilicon layer 26 using mask 28' to pattern the etching, with the etchant etching through the openings in the mask 28'.

Oxide Etching

The film 28 of silicon dioxide is etched through openings in mask 28' using a conventional etching process silicon dioxide.

Polysilicon or Polycide Etch

The polysilicon layer 26 is etched using $SF_4$, $Cl_2$ or HBr and mask 28' to form word lines 26, 26' and 26".

Next, the mask 28' is stripped from the device 10.

FIG. 6 shows a plan view of a device 10 in accordance with this invention with the buried common base regions (word lines) 23, 23' and 23" end the polysilicon bit lines 26 and 26'. The emitter regions 25 and 25' indicate that the cells cells 21 and 21' are on. The cell 21" is "off". Restating the above in general terms, a cell which contains an emitter region is an "on" cell and a cell without an emitter region is an "off" cell.

FIG. 7 shows a section of the device of FIG. 6, in accordance with this invention, taken along line 7—7. The substrate 10 includes the collector 19 over which is formed the base region 23, which is coated by thin silicon dioxide "oxide" layer 29. The cells 21 and 21' are shown with the emitter 25 beneath the "ON" cell 21 and no emitter beneath the "OFF" cell 21". The cell 21 includes the emitter region 25 in the base region 23 beneath the polysilicon bit line 26 which is coated by silicon dioxide layer 28. The cell 21" includes the polysilicon bit line 26' which is also coated by silicon dioxide layer 28.

There are two alternatives for the bipolar device which provide either an NPN or a PNP bipolar ROM device.

In one case, the ROM is formed with an N− collector region 19, a P− base region 23 and an N+ emitter region 25 for an NPN bipolar ROM device.

Alternatively, the ROM is formed with a P− collector region 19, an N− base region 23 and a P+ emitter region 25 for an PNP bipolar ROM device.

Spacer Formation

Figure 8:
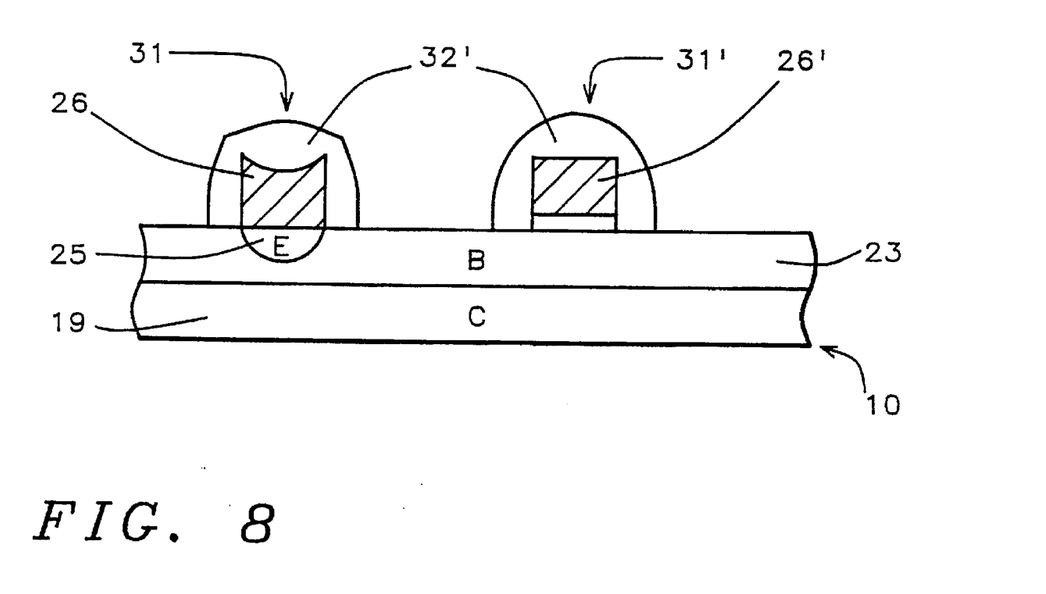
FIG. 8 is a cross sectional view taken along section line 9—9 in FIG. 10.
Figure 10:
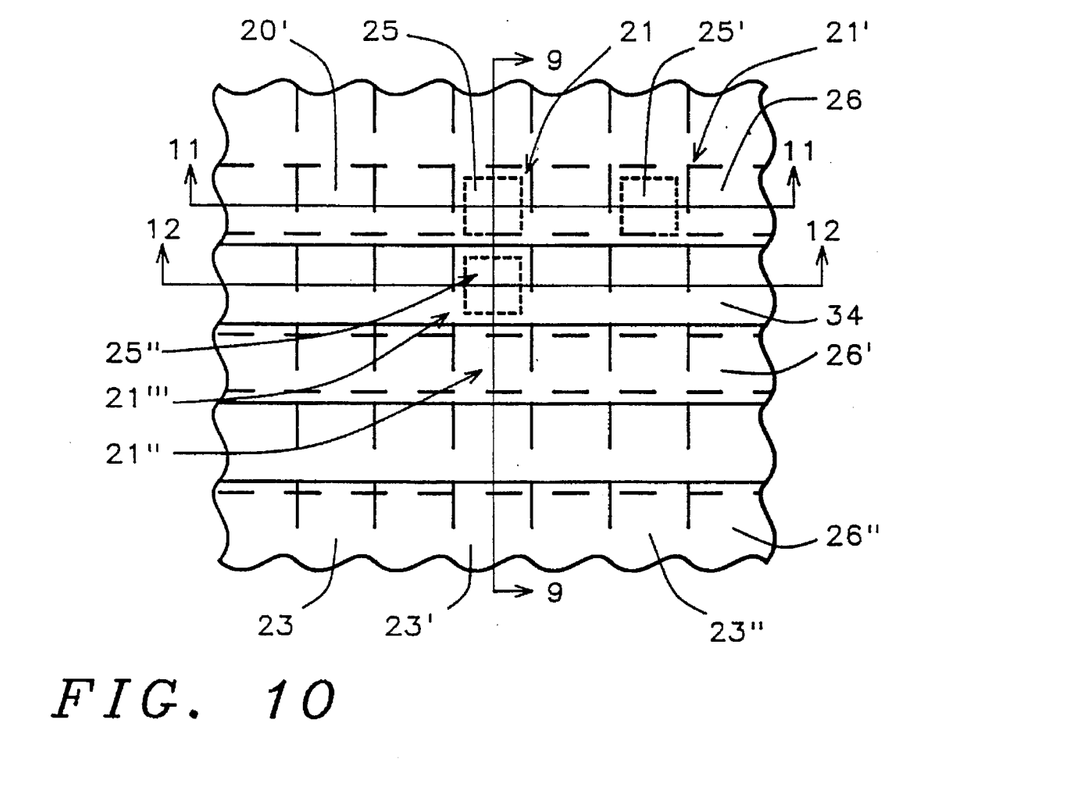
FIG. 10 shows a plan view of a device in accordance with this invention with the buried common base regions (word lines) and the polysilicon bit lines.

FIG. 8 is a cross sectional view taken along section line 9—9 in FIG. 10. FIG. 8 shows an alternative more dense structure and the first stages of an alternative process suitable to produce a denser structure. The elements in FIG. 8 are analogous to those seen in FIG. 7 and like elements have like reference numbers although the design is denser.

CVD Oxide Deposition

Prior to the process stage shown in FIG. 8, a CVD silicon dioxide deposition was performed producing a blanket silicon dioxide spacer layer 32 over the device of FIG. 8, so that the polysilicon bit lines 26, 26' and 26" are coated by silicon dioxide spacer layer 32 which has been etched back to form silicon dioxide spacers 32, 32' and 32" as described below.

Spacer Etch Back Process

The silicon dioxide spacer layer 32 is etched back in a conventional spacer etch back process to form spacers 32, 32', and 32" herefrom, with the remainder of the silicon dioxide being removed as is well known to those skilled in the art leaving the structure shown in FIG. 8, with the thin silicon dioxide layer 29 etched away by the spacer layer etchant where the spacer layer 32 has been etched back. In this case the spacer layer 32 covers the upper surface of the bit lines 26 and 26' as the etching is terminated early enough to permit this layer to remain.

Bipolar Code Mask 2

Figure 9:
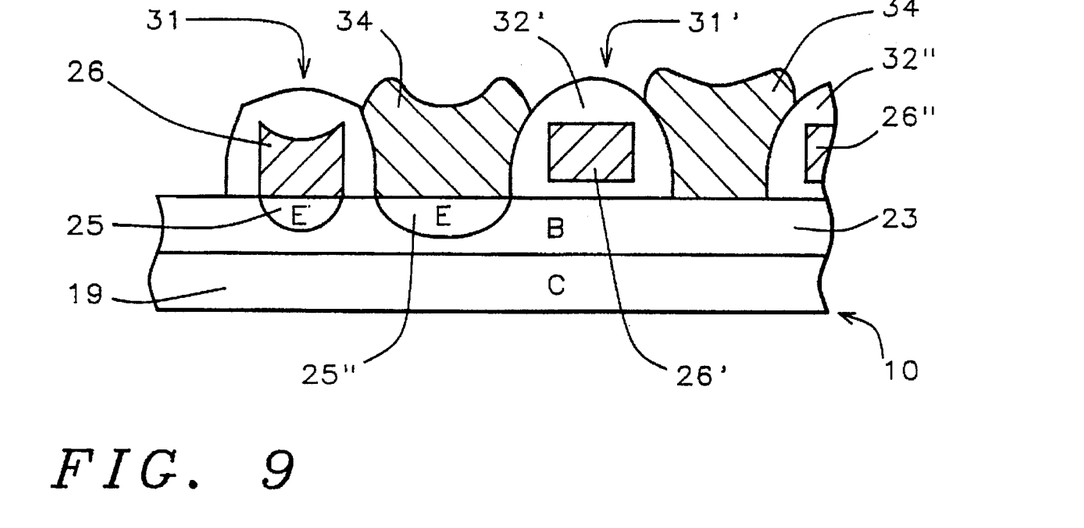
FIG. 9 is a cross sectional view taken along section line 9—9 in FIG. 10.

FIG. 9 is a cross sectional view taken along section line 9—9 in FIG. 10. FIG. 9 shows the next steps in processing the device of FIG. 8 to form the structure with a second layer of polysilicon 34, 34' and a second bipolar code mask.

Thin Oxide 2 Deposition

A thin film of silicon dioxide layer 33 is formed on the surface of base region 23 in a furnace to a thickness within the range from 50 Å to 1000 Å in the openings between the spacers 32' and 32" in FIG. 9, by a mask which has been removed prior to the stage shown in FIG. 8.

Emitter Mask

A photoresist mask (not shown) for the second code mask (bipolar code mask 2) is formed in the pattern of emitter 25" shown in FIGS. 9 and 10.

Polysilicon 2

Polysilicon 2 Deposition

A layer 34 of polysilicon 2 is applied to the device as shown in FIG. 9. The method of applying the polysilicon 2 layer 34 comprises use of an LPCVD process with $SiH_4$ or $SiH_6$ gas at a temperature from about 500° C. to about 700° C.

Polysilicon Doping

The polysilicon layer 34 is doped in a blanket doping process with a material selected from a P/As implant of ions 18 or diffusion of $POCl_3$.

The parameters of a P/As ion implant are a dose of the P/As ions implanted within the range from about $1\times10^{14}$/ cm² to about 5×10¹⁶/cm² at from about 15 keV to about 200 keV, then annealing at a temperature from about 700° C. to about 1,000° C. for a time from 5 minutes to two hours.

An out-diffusion from polysilicon layer 34 into base region 23 forms emitter 25". If doping is performed by ion implantation then the out-diffusion occurs during the annealing process.

The parameters of a diffusion of POCl₃ are heating in an oven at a temperature from about 750° C. to about 1,000° C. for a time from 10 minutes to three hours.

As stated above, an out-diffusion from polysilicon layer 26 forms emitters 25 and 25'. For POCl₃ doping by diffusion, out-diffusion occurs simultaneously with the diffusion process used for such doping.

Polysilicon Mask

A photoresist mask for the polysilicon is formed in the pattern of polysilicon word lines 34 and 34' shown in FIG. 9.

Polysilicon 2 Etch

The polysilicon 2 layer 34 is etched using SF₄, Cl₂ or HBr and mask 28' to form additional bit lines 34 and 34'.

Next, the mask 44 is stripped from the device 10.

FIG. 10 shows a plan view of a device in accordance with this invention with the buried common base regions (word lines) 23, 23' and 23" and the polysilicon bit lines 26, 26' and 26". The emitter regions 25, 25' and 25" indicate that cells 21, 21' and 21'" are "on", but the cell 21" is "off" since it has no emitter implant.

Figure 11:
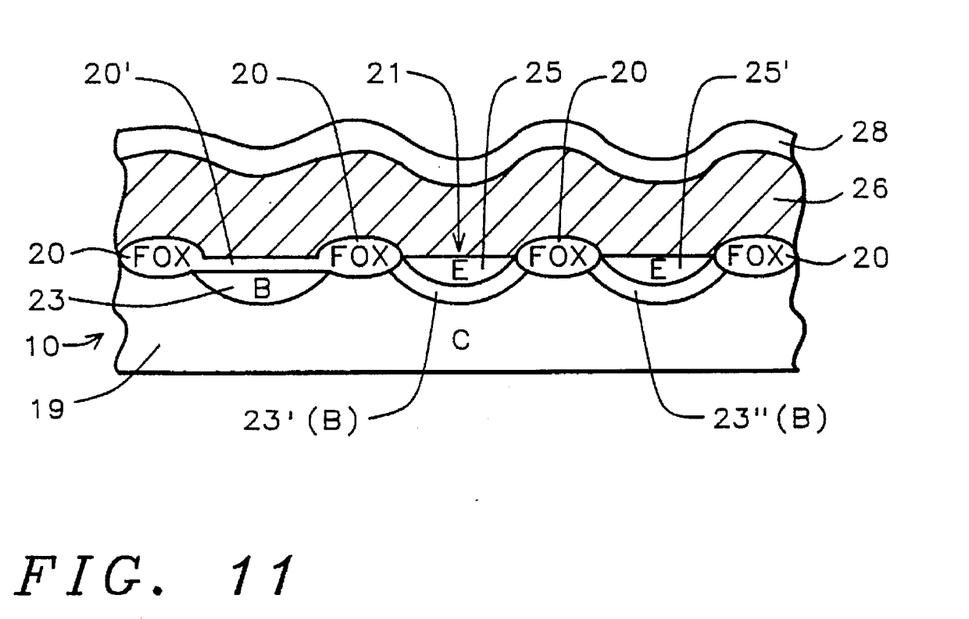
FIG. 11 is a section taken along line 11—11 in FIG. 10, which is taken along "odd" bit line after a polysilicon 2 etch, with the polysilicon 1 visible, but the polysilicon 2 absent in that region.

FIG. 11 is a section taken along line 11—11 in FIG. 10, which is taken along "odd" bit line 26 after the polysilicon 2 etch, with the polysilicon 1 26 visible, but the polysilicon 2 absent in that region with the reference numbers referring to the same materials as those described above. Accordingly, the details of the subject matter with the same reference numbers described in connection with previous drawings is relied upon for completion of the description of FIGS. 11 and 12.

Figure 12:
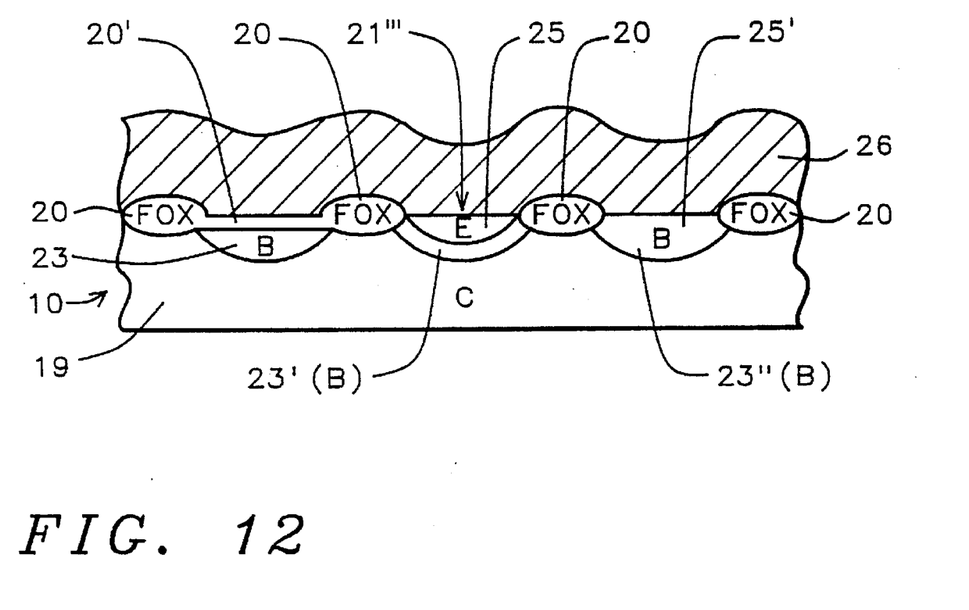
FIG. 12 is a section taken along line 12—12 in FIG. 10.

FIG. 12 is a section taken along line 12—12 in FIG. 10, which is taken along "even" bit line 34, after the polysilicon 2 etch with the polysilicon 2 34 visible, but the polysilicon 1 26 absent.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a bipolar ROM device on a semiconductor substrate by:

forming a collector region by doping with a dopant of a first polarity;

forming an array of common base elements by doping with a dopant of an opposite polarity;

selectively forming a first plurality of emitter regions by doping with a dopant of said first polarity to thereby program said bipolar ROM device; and forming a first array of conductors disposed orthogonally relative to said array of common base elements, said conductors being connected to emitter regions traversed thereby.

2. A method of forming a bipolar ROM device in accordance with claim 1 wherein said emitter regions are selectively doped by diffusion from said conductors at regions where no oxide layer is formed between a one of said emitter regions and a corresponding one of said conductors.

3. A method of forming a bipolar ROM device on a semiconductor substrate by:

forming a collector region by doping with a dopant of a first polarity;

forming an array of common base elements by doping with a dopant of an opposite polarity;

selectively forming a first plurality of emitter regions by doping with a dopant of said first polarity to thereby program said bipolar ROM device, wherein said emitter regions are selectively formed to define cells representing "1" data and selectively not formed to define cells representing "0" data; and forming a first array of conductors disposed orthogonally to said array of common base elements, said conductors being connected to emitter regions traversed thereby.

4. A method of forming a bipolar ROM device in accordance with claim 3 wherein said emitter regions selectively not formed are separated from a corresponding conductor by a layer of insulating material.

5. A method of forming a bipolar ROM device in accordance with claim 1 wherein a second array of conductors is interleaved with said first array of conductors, and a second plurality of emitter regions is associated therewith.

6. A method of forming a bipolar ROM device in accordance with claim 5 wherein said second array of conductors is formed subsequent to formation of said first array of conductors.

7. A method of forming a bipolar ROM device in accordance with claim 1 wherein each of said common base elements is formed between adjoining field oxidation regions.

8. A method of forming a bipolar ROM device in accordance with claim 7 wherein said common base elements is formed by a self-aligned ion implantation performed using said field oxidation regions to prevent ion implantation therebelow.

9. A method of forming a bipolar ROM device in accordance with claim 8 wherein said conductors comprise a layer of polysilicon.

10. A method of forming a bipolar ROM device in accordance with claim 9 wherein said emitter regions are selectively doped by diffusion from said conductors.

11. A method of forming a bipolar ROM device on a semiconductor substrate by:

forming a collector region by doping with a dopant of a first polarity;

forming an array of common base elements by doping with a dopant of an opposite polarity, each of said common base elements formed between adjoining field oxidation regions by a self-aligned ion implantation performed using said field oxidation regions to prevent ion implantation therebelow;

selectively forming a first plurality of emitter regions by doping with a dopant of said first polarity to thereby program said bipolar ROM device, wherein said emitter regions are selectively formed to define cells representing "1" data and selectively not formed to define cells representing "0" data; and forming a first array of conductors from a layer of polysilicon, the conductors disposed orthogonally to said array of common base elements, said conductors being connected to emitter regions traversed thereby, wherein said emitter regions are selectively doped by diffusion from said conductors.

12. A method of forming a bipolar ROM device in accordance with claim 11 wherein a second array of conductors is interleaved with said first array of conductors, and a second plurality of emitter regions is associated therewith.

13. A method of forming a bipolar ROM device in accordance with claim 12 wherein said emitter regions are formed by diffusion from said arrays of conductors.

14. A method of forming a bipolar ROM device in accordance with claim 13 wherein said second array of conductors is formed subsequent to formation of said first array of conductors.

* * * * *